US008788747B2

(12) United States Patent
Ahn et al.

(10) Patent No.: US 8,788,747 B2
(45) Date of Patent: Jul. 22, 2014

(54) INDEPENDENTLY CONTROLLED VIRTUAL MEMORY DEVICES IN MEMORY MODULES

(75) Inventors: Jung Ho Ahn, Palo Alto, CA (US); Norman P. Jouppi, Palo Alto, CA (US); Jacob B. Leverich, San Mateo, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 340 days.

(21) Appl. No.: 13/058,188

(22) PCT Filed: Aug. 8, 2008

(86) PCT No.: PCT/US2008/009523
§ 371 (c)(1),
(2), (4) Date: Feb. 8, 2011

(87) PCT Pub. No.: WO2010/016818
PCT Pub. Date: Feb. 11, 2010

(65) Prior Publication Data
US 2011/0145493 A1 Jun. 16, 2011

(51) Int. Cl.
*G06F 12/00* (2006.01)
(52) U.S. Cl.
USPC .................... 711/105; 711/E12.069; 711/118
(58) Field of Classification Search
USPC ......................................... 711/105
See application file for complete search history.

(56) References Cited

U.S. PATENT DOCUMENTS

| 5,960,468 A * | 9/1999 | Paluch .......................... 711/219 |
| 5,982,696 A | 11/1999 | Rao |
| 6,182,253 B1 | 1/2001 | Lawrence et al. |
| 6,693,846 B2 | 2/2004 | Fibranz |
| 7,505,890 B2 * | 3/2009 | Kuznetsov et al. ............. 703/27 |
| 2007/0156947 A1 | 7/2007 | Vaithiananthan et al. |
| 2007/0192563 A1 | 8/2007 | Rajan et al. |
| 2008/0031030 A1 | 2/2008 | Rajan et al. |

FOREIGN PATENT DOCUMENTS

| JP | 2003-006042 | 1/2003 |
| JP | 2009-301415 | 12/2009 |
| WO | WO-2007-038225 A2 | 4/2007 |
| WO | WO-2007-095080 A2 | 8/2007 |

OTHER PUBLICATIONS

Extended Search Report, PCT/US2008009523, Aug. 8, 2011, 8 pages.
International Search Report, PCT/US2008/009523, Mar. 19, 2009.

* cited by examiner

*Primary Examiner* — Reginald Bragdon
*Assistant Examiner* — Hamdy S Ahmed

(57) ABSTRACT

Various embodiments of the present invention are directed a multi-core memory modules. In one embodiment, a memory module (500) includes at least one virtual memory device and a demultiplexer register (502) disposed between the at least one virtual memory device and a memory controller. The demultiplexer register receives a command identifying one of the at least one virtual memory devices from the memory controller and sends the command to the identified virtual memory device. In addition, the at least one virtual memory devices include at least one memory chip.

13 Claims, 13 Drawing Sheets

VMD$_{n-2}$ address = 11 ... 1101

INDEPENDENTLY CONTROLLED VIRTUAL MEMORY DEVICES IN MEMORY MODULES

TECHNICAL FIELD

Embodiments of the present invention are directed to memory modules, and, in particular, to memory modules configured to allow independent control of individual virtual memory devices comprising one or more memory chips.

BACKGROUND

In modern computer systems, demand for memory capacity and bandwidth keeps growing. Recent performance scaling of microprocessors relies on increasing the number of cores per chip, and multi-core and many core chip multi-processors ("CMP") demand even higher memory bandwidth and capacity through multiple memory controllers per processor. So the power budget of main memory modules becomes similar to or even higher than that of processors in current computer systems.

However, typical memory modules are energy inefficient. For example, too many bits are activated per memory access and most of the bits that are accessed are stored back without being used, wasting dynamic power. Multiple temporally adjacent memory accesses can be combined by either a compiler or memory controller to use more bits per memory activation exploiting locality of access patterns, but these attempts achieve limited success in applications with irregular access patterns. The efficiency of this approach is restricted by the random nature of memory accesses in general applications and even exacerbated in CMP memory systems, since independent memory access requests from multiple threads are interleaved.

What is desired is a memory system enabling access to information stored in the memory system that saves energy without significantly sacrificing system performance.

SUMMARY

Various embodiments of the present invention are directed to multi-core memory modules. In one embodiment, a memory module includes at least one virtual memory device and a demultiplexer register electronically connected to the at least one virtual memory device and a memory controller. The demultiplexer register receives a command identifying one of the at least one virtual memory devices from the memory controller and sends the command to the virtual memory device indentified by the command. Each of the at least one virtual memory devices includes at least one memory chip.

DETAILED DESCRIPTION

Various embodiments of the present invention are directed to multi-core memory modules, which are designed to improve the energy efficiency of memory systems with small impact on system performance. The memory modules include memory chips that are partitioned into groups of one or more memory chips called "virtual memory devices" ("VMDs"). The memory chips can be dynamic random access memory ("DRAM") chips. Each VMD has its own data path and can receive separate memory requests over a command bus in a time-division multiplexed manner. As a result, fewer memory chips are involved per memory access and fewer bits are stored back than conventional memory modules. The memory chips can be used without any modification and few functionality changes are added to the memory module registers to provide different commands to each VMD.

The detailed description is organized as follows. A general description of conventional memory modules and associated energy inefficiencies are described in a first subsection. A description of memory module embodiments and energy efficient enhancements are provided in a second subsection.

Memory Modules and Energy Inefficiencies in Accessing Memory

Figure 1A:
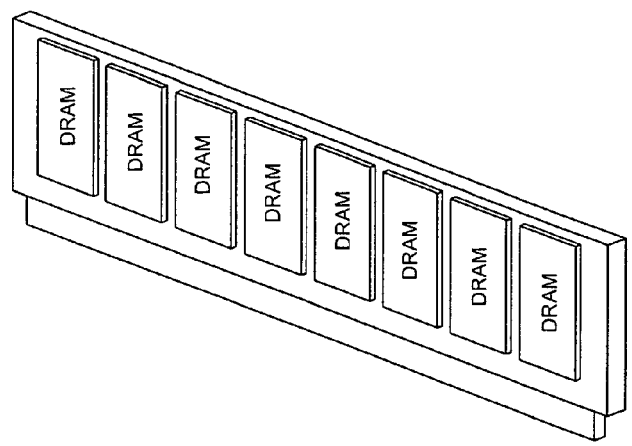
FIG. 1A shows an isometric view of a memory module with eight memory chips.
Figure 1B:
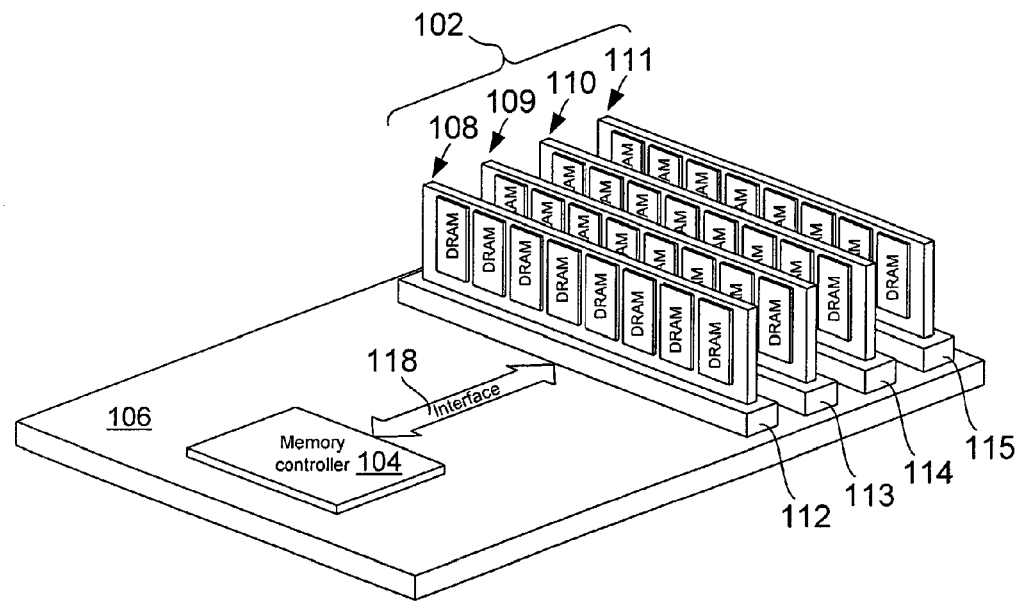
FIG. 1B shows an isometric view of memory modules and a memory controller mounted on circuit board.

Memory modules are typically comprised of several DRAM chips mounted on a printed circuit board forming a storage unit called a "dual-in-line memory module" ("DIMM"). FIG. 1A shows an isometric view of a single DIMM comprising eight DRAM chips. One or more DIMMs are then mounted on a circuit board and controlled by a memory controller. FIG. 1B shows an isometric view of memory 102 and a memory controller 104 mounted on circuit hoard 106. The memory 102 is composed of four DIMMs 108-111 inserted into four DIMM slots 112-115. The memory controller 104 is a computer chip or part of a multi-core microprocessor chip that manages the flow of commands and data sent to and from the DIMMs 108-111 and interfaces the memory 102 with other major components of a computer system, such as the central processing unit. Each DIMM is in electrical communication with the memory controller 104 via an interface 118. The interface 118 is a bus that carries the clock signal and commands from the memory controller 104 to the memory 102 and data signals between the DIMMs 108-111 and the memory controller 104. Data signals are sent in parallel between the memory controller 104 and DRAM chips in the DIMMs 108-111. The interface 118 can support single-data rate ("SDR"), double-data rate ("DDR"), and higher data rate transfers. SDR refers to transmitting data once per clock cycle, and DDR refers to transmitting data on both the rising and falling edges of the computer system clock signal. The memory controller 104 and the DIMMs 108-111 can be configured to transmit and receive data in accordance with SDR and DDR. By using both edges of the clock in DDR, the data signals operate at the same limiting frequency, doubling the data transmission rate over single-data rate transmissions.

Figure 2:
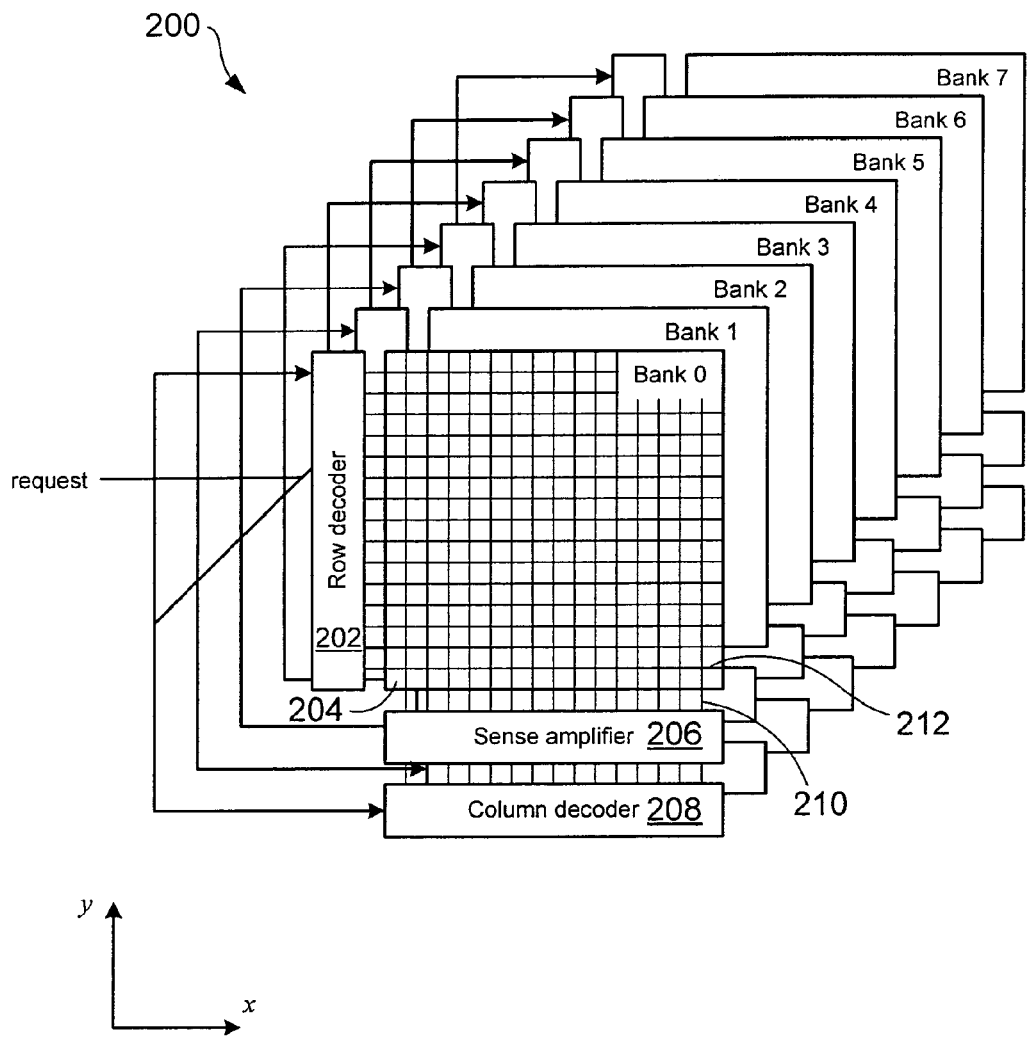
FIG. 2 shows a schematic representation of eight banks comprising a memory chip.

A DRAM chip stores a bit in a structure called a DRAM memory cell consisting of a transistor and a capacitor. There are billions of cells in a single DRAM chip and the cells can be organized in a two-dimensional arrangement of numerous two-dimensional arrays called "banks." FIG. 2 shows a schematic representation of eight banks denoted 0-7 comprising a DRAM chip 200. As shown in the example of FIG. 2, each bank is connected to a row decoder, a sense amplifier, and a column decoder via intersecting signal lines. For example, Bank 0 is connected to row decoder 202 via signal lines running parallel to the x-axis, such as signal line 204. Bank 0 is also connected to sense amplifier 206 and column decoder 208 via signal lines running parallel to the y-axis, such as signal line 210. Memory cells are located at signal line intersections. For example, a memory cell 212 is located at the point where signals 204 and 210 intersect.

The commands sent from the memory controller 104 to the memory 102 include READ, WRITE, ACTIVATE, REFRESH, and PRECHARGE. Commands are composed of control signals and address signals. A control signal represents the operation performed by the command and the address signal identifies the bank and row or column addresses in the DRAM chips where the command is performed. For example, an ACTIVATE command is composed of an activation control signal and bank and row addresses identifying which bank and row within a DRAM chip the ACTIVATE command is performed. READ and WRITE commands are composed of read and write control signals and bank and column addresses identifying in which bank and column in the DRAM chip the READ and WRITE commands are performed.

Data stored in the banks of the DRAM chip 200 is accessed in two steps. First, a memory controller (not shown) sends an ACTIVATE command specifying a row address and a bank address of the DRAM chip 200. All bits in the row, which is typically 8 or 16 Kbits of the bank, are activated into sense amplifiers within the bank. Second, one or more READ/WRITE commands specifying the bank and column addresses are sent. The number of bits transferred per READ/WRITE transaction is determined by the size of the data bus and the burst length. The burst length is a common memory-related, basic input/output system setting that controls the number of READ/WRITE operations performed in a single burst transaction or high-speed transmission of data blocks. Typically, the burst length is set to 4 or 8. When a DRAM chip receives, for example, a memory READ request, the chip responds by supplying data across the signal lines of the interface 118. The size of the block of data sent in response to the memory READ request is determined by the burst length. A memory module with a 64 bit wide data bus (i.e., 64 single-ended signal lines or 128 differential signal lines) and DRAM chips configured to support a burst length of 4 sends a data block of 32 bytes (4×64 bits=32 bytes) in response to a single READ request from the memory controller. On the other hand, a memory module with a 64 bit wide data bus and DRAM chips configured to support a burst length of 8 sends a data block of 64 bytes (8×64 bits=64 bytes) in response to a single READ request from the memory controller When data is read in two different rows in the same bank of a DRAM chip, the first row must be written back, the bitlines charged, and the second row latched by the PRECHARGE and ACTIVATE commands before the data in the second row can be read. The PRECHARGE command writes the row back into the DRAM bank, which is necessary because the ACTIVATE command reads destructively. The bank address is given by a small number of bits in the READ, WRITE, ACTIVATE, and PRECHARGE commands. These command operations often take about 50 ns between a first ACTIVATE and a second ACTIVATE command in the same bank. Thus, unless there are many READ/WRITE commands between ACTIVATE and PRECHARGE commands, command/address/data buses often sit idle. However, if data is read in different banks, commands to different banks can be pipelined because the ACTIVATE to ACTIVATE time between two different banks is shorter by about 8 ns. Thus, higher throughput can be achieved by interleaving requests in different banks, especially when there are not many READ/WRITE commands between ACTIVATE and PRECHARGE command pairs.

Figure 3A:
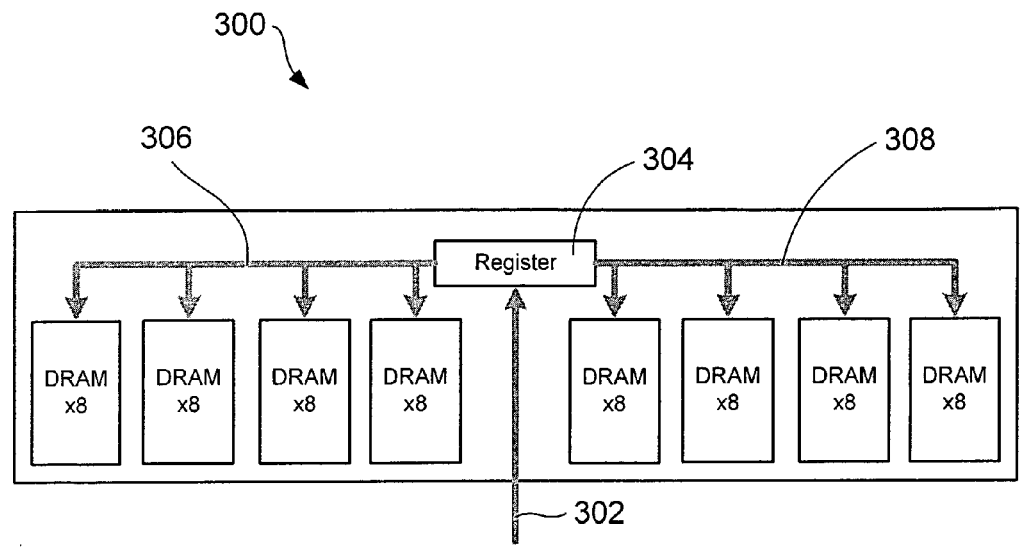
FIG. 3A shows a schematic representation of a conventional memory module.

FIG. 3A shows a schematic representation of a conventional DIMM 300 that includes 8 DRAM chips, each of which has an 8 bit data bus. Directional arrow 302 represents the distribution of commands that are sent from a memory controller (not shown) to an optional device called a register 304. The register 304 is located on a bus between the memory controller and the DRAM chips. The register 304 latches command signals from the memory controller then forwards them with better signal quality and timing margin to each DRAM chip in order to lessen the electrical load on the memory controller and maintain stability of command signals. The register 304 can also buffer commands and broadcast clock signals to DRAM chips in order to facilitate overlapping access to different DIMMs in systems with multiple DIMMs per memory controller. The register 304 broadcast the commands to all 8 DRAM chips over a bus, as indicated by branching directional arrows 306 and 308. In other conventional memory modules, commands are broadcast to the DRAM chips without the register 304.

Figure 3B:
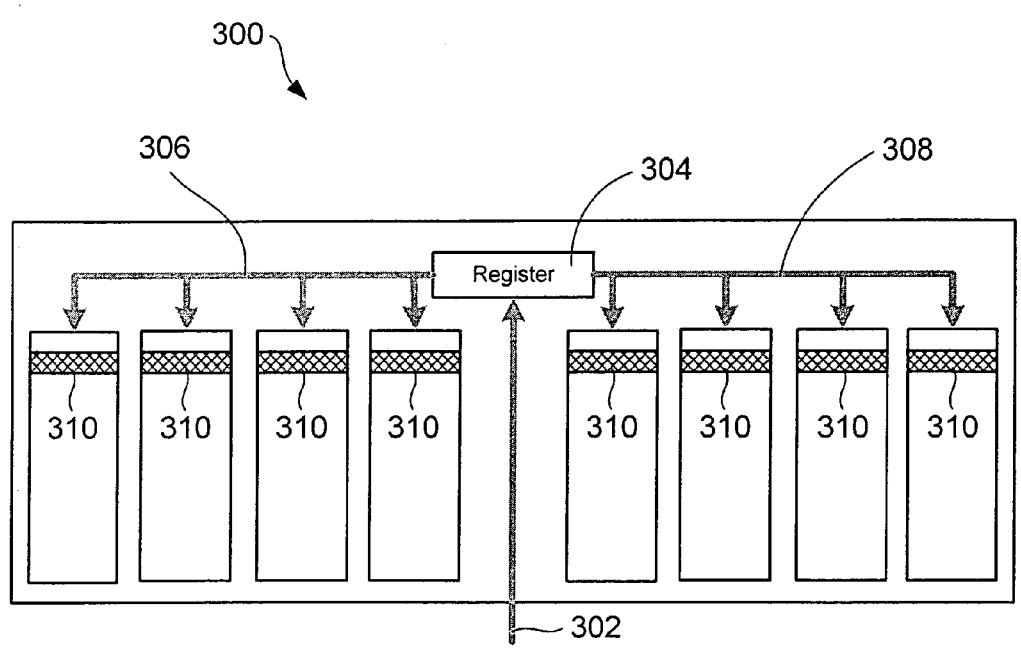
FIG. 3B shows an example of broadcasting a command to all memory chips of a conventional memory module.

FIG. 3B shows an example of a conventional DIMM operation. As shown in the example of FIG. 3B, all of the DRAM chips within the DIMM 300 receive the same commands from the memory controller and activate the same row in each DRAM chip represented by shaded regions 310. As a result, all of the DRAM chips within the DIMM 300 act as a single DRAM chip with wider data paths and larger rows.

As described above with reference to FIG. 2, the size of a DRAM chip row is typically 8 (or 16 Kbits). In order to read a cache line or write a cache line to a DIMM, the READ/WRITE command is broadcast to all DRAM chips, and each DRAM chip activates the same row. In other words, in a typical DIMM consisting of 8 DRAM chips, each DRAM chip activates the same row address comprising 8 Kbits. Thus 8×8 Kbits or 64 Kbits of DRAM cells of a DIMM are activated at one time, which is larger than the size of the cache line to be read or written. A typical cache line is on the order of 64 bytes or 512 bits. Thus, because READ and WRITE commands are typically read or written in one cache line using less than 1% of the activated DRAM cells, over 99% of the DRAM cells that are activated are unused for a single READ or WRITE transaction, which is an inefficient use of energy.

Embodiments of the Present Invention

Figure 4A:
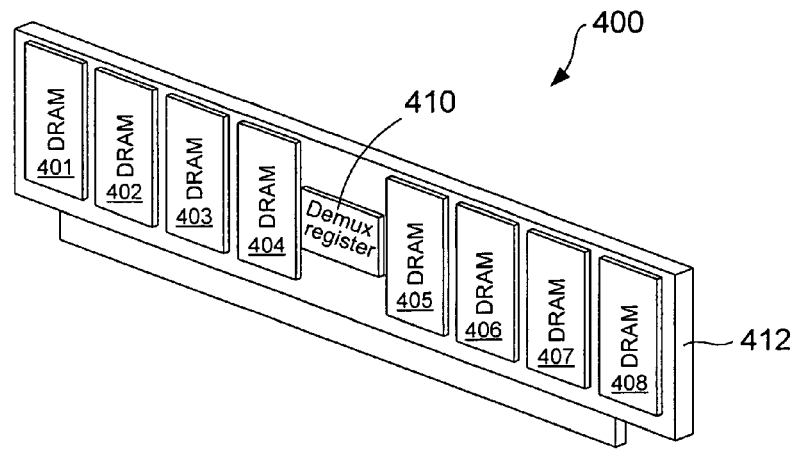
FIG. 4A shows an isometric view of a single multi-core memory module configured in accordance with embodiments of the present invention.

Memory module embodiments of the present invention introduce a demultiplexer register ("demux register") for receiving commands from a memory controller. The memory chips can be grouped together into VMDs and are mounted on a printed circuit board with the demux register to form a single storage unit called a "multi-core, dual in-line memory module" ("MCDIMM"). In certain embodiments, the memory chips can be DRAM chips. FIG. 4A shows an isometric view of a single MCDIMM 400 comprising eight DRAM chips 401-408 and a demux register 410 disposed on circuit board 412 configured in accordance with embodiments of the present invention. The DRAM chips 401-408 can be grouped into VMDs comprising one or more DRAM chips, examples or which are described in greater detail below.

Figure 4B:
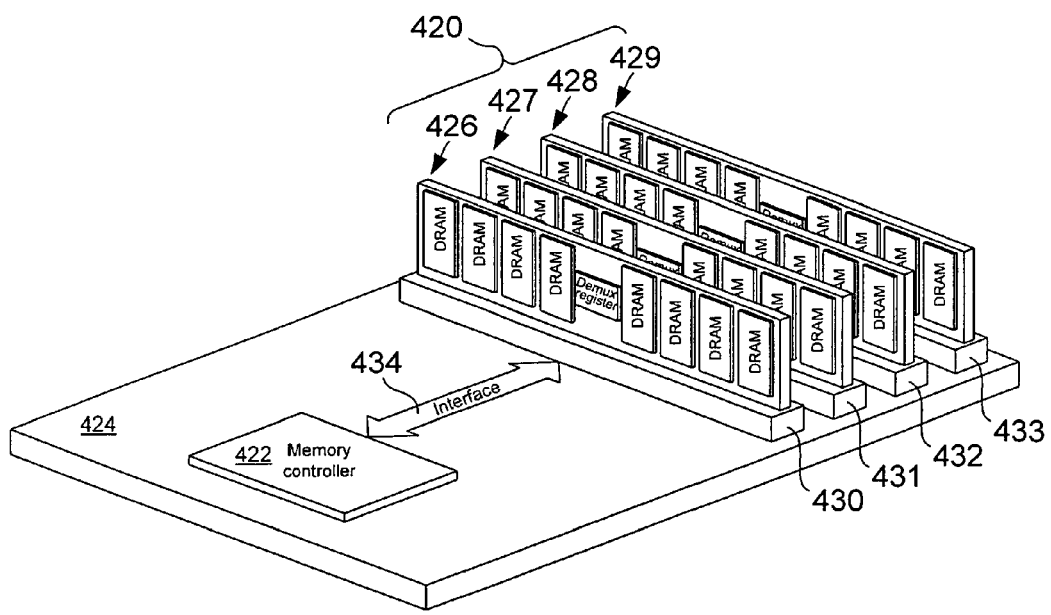
FIG. 4B shows an isometric view of multi-core memory modules and a memory controller mounted on circuit board in accordance with embodiments of the present invention.

Like conventional DIMMs, one or more MCDIMMs can be mounted on a circuit board and controlled by a memory controller. FIG. 4B shows an isometric view of memory 420 and a memory controller 422 mounted on circuit board 424 in accordance with embodiments of the present invention. The memory 420 comprises MCDIMMs 426-429 inserted into DIMM slots 430-433, respectively. The MCDIMM 400 has an interface 434 between the memory controller 422 and the demux registers of the memory modules 426-429. The interface 434 includes a bus that carries command signals from the memory controller 422 to the memory 420 and a data bus that carries data signals between the memory controller 422 and the memory 420. In this architecture, commands sent by the memory controller 422 are not broadcast to the DRAM chips of the memory 420. Instead, the memory controller 420 sends commands to the demux registers of the MCDIMMs 426-429. Each of the MCDIMMs 426-429 includes a command bus that enables a demux register to send the commands directly to the VMDs.

Figure 5A:
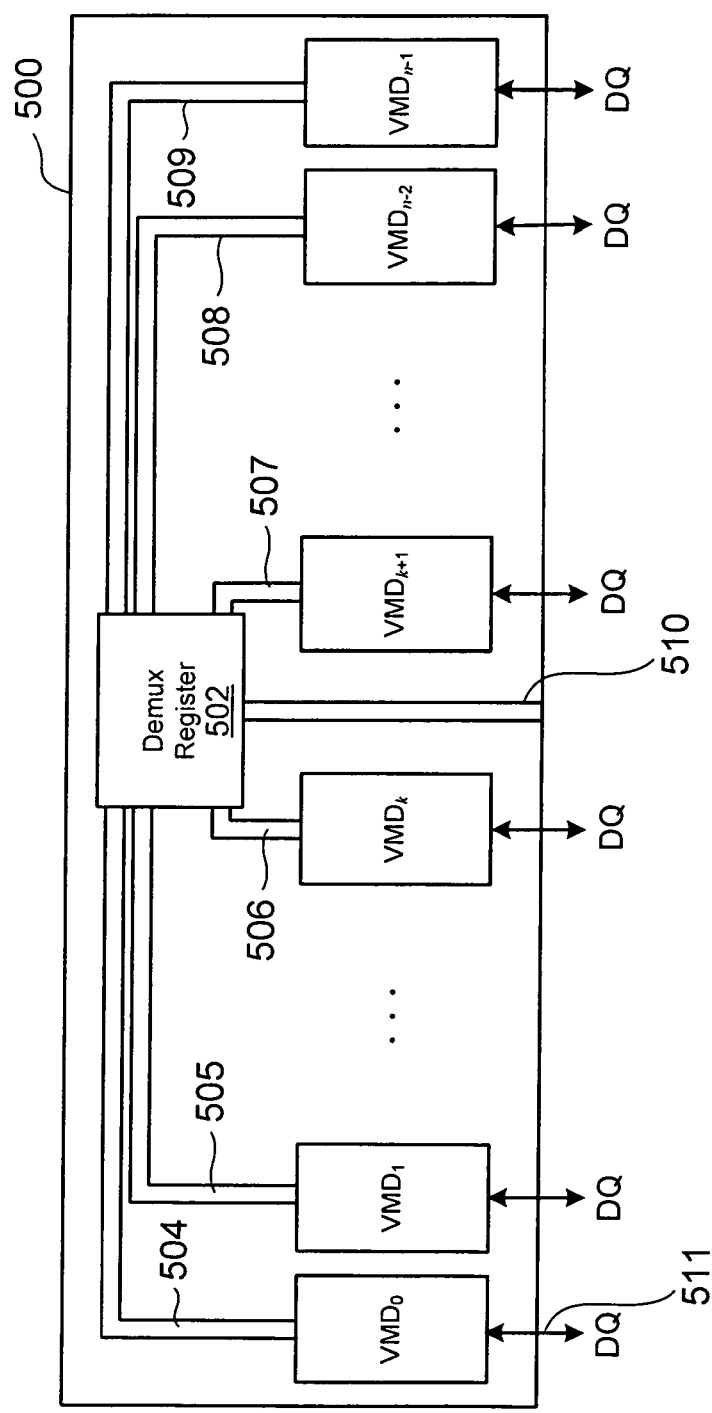
FIG. 5A shows a general schematic representation of a multi-core, dual in-line memory module configured in accordance with embodiments of the present invention.

FIG. 5A shows a general schematic representation of a MCDIMM 500 configured in accordance with embodiments of the present invention. The MCDIMM 500 includes n VMDs, where n is an integer representing the number of VMDs in the MCDIMM 500. Eight of the VMDs are represented in FIG. 5A and denoted by $VMD_k$, where the subscript k is an integer ranging from 0 to n−1. The MCDIMM 500 is configured so that each of the VMDs is connected to a demux register 502 via a separate set of signal lines. Two different embodiments for the demux register 502 are described below with reference to FIGS. 5B and 5C. For example, $VMD_0$, $VMD_1$, $VMD_k$, $VMD_{k+1}$, $VMD_{n-2}$, and $VMD_{n-1}$ are connected to the demux register 502 via sets of signal lines 504-509. The combined sets of signal lines connecting the VMDs to the demux register 502 is called a "command bus." Each VMD can be composed of one or more memory chips, such as DRAM chips. Commands sent from a memory controller (not shown) to the MCDIMM 500 arrive at the demux register 502 over a set of signal lines 510 called a "command path." Each of the VMDs exchanges data with the memory controller on a separate data bus identified in FIG. 5A by double headed arrows, such as double headed arrow 511.

Figure 5B:
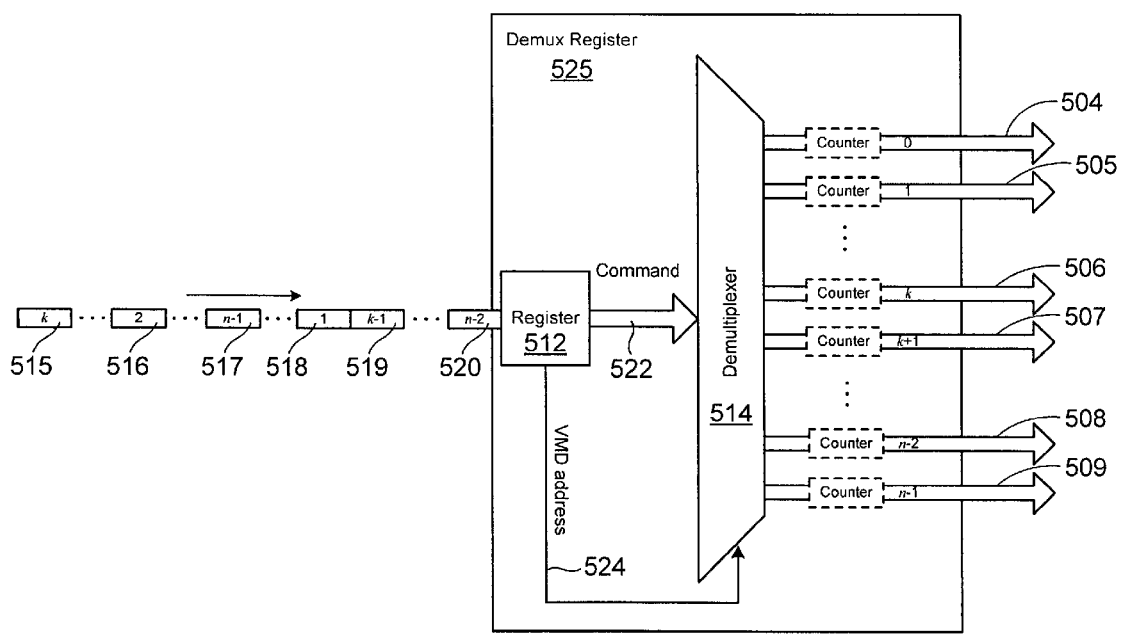
FIG. 5B shows a schematic representation of a first demultiplexer register configured in accordance with certain embodiments of the present invention.

FIG. 5B shows a schematic representation of a first demux register 525 configured in accordance with embodiments of the present invention. The demux register 525 is composed of a register 512 and a demultiplexer 514. The demux register 525 receives commands from the memory controller via the command path 510 of FIG. 5A. The commands are time-division multiplexed. In other words, each command is encoded in a bit stream sent from the memory controller to the demux register 525 in a fixed duration time slot. In FIG. 5B, the time slots of the time-division multiplexed commands are represented by a series of rectangles 515-520. Each of the commands represented in FIG. 5B includes the index of the VMD in FIG. 5A that is intended to receive the command. The order in which the commands are sent to the demux register 525 is determined by the memory controller. Thus, the commands appear in FIG. 5B in that order. Embedded within a command is a control signal identifying the particular kind of operation to be performed, address signals identifying a bank, a row, or a column, and a VMD address identifying a particular VMD assigned by the memory controller to receive the command. For example, when a command is to be sent to a particular VMD, the memory controller creates a command including the VMD address identifying the VMD. In general, the VMD address is a bit string comprising $\log_2 n$ bits.

The register 512 is a buffer that receives and temporarily stores the commands. The demultiplexer 514 includes two inputs. The register sends the command to one input and sends the VMD address to the other input as represented by directional arrows 522 and 524. The demultiplexer 514 uses the VMD address to select the appropriate set of signal lines of the command bus leading to the VMD identified by the VMD address. In FIG. 5B, six of the n sets of signal lines of the command bus are represented by directional arrows 504-509 corresponding to the sets of signal lines 504-509 and are labeled with the index of the associated VMD shown in FIG. 5A. Note that each command is processed separately by the demux register 525 within a particular time interval before a subsequent command is processed.

Consider, for example with reference to FIGS. 5A-5B, that the memory controller sends command k−1 519 to the $VMD_k$. In FIG. 5A, the command k−1 519 is sent along the command path 510 to the demux register 525. As shown in FIG. 5B, the register 512 receives and temporarily stores the command k−1 519, and the VMD address and the command are sent to the demultiplexer 514, which then selects the appropriate set of signal lines 506 to send the command k−1 519 to the $VMD_k$ in FIG. 5A. After the command k−1 519 is sent, the next command 1 518 is processed in a similar manner.

As shown in FIG. 5B, the demux register 525 optionally includes counters associated with each set of signal lines. Counters may be needed when the DRAM chips of a VMD cannot support a long burst length associated with a READ or WRITE transaction of a cache line. The demux register partitions the cache line into cache-line segments and translates the command into multiple commands, each command corresponding to a cache-line segment. Thus, each cache-line segment sent to the VMD is preceded by a corresponding command sent by the counter. For example, when the burst length of one or more DRAM chips of a VMD cannot be set long enough to cover a cache line, the counter translates a column-level command such as READ or WRITE into a number of READ/WRITE commands for each cache-line segment so that each cache-line segment can be separately READ or WRITTEN to the DRAM chip. Each counter includes a counting device that keeps track of the number of commands generated for a partitioned cache line. The translation carried out by the counters saves command bandwidth from the memory controller.

Figure 5C:
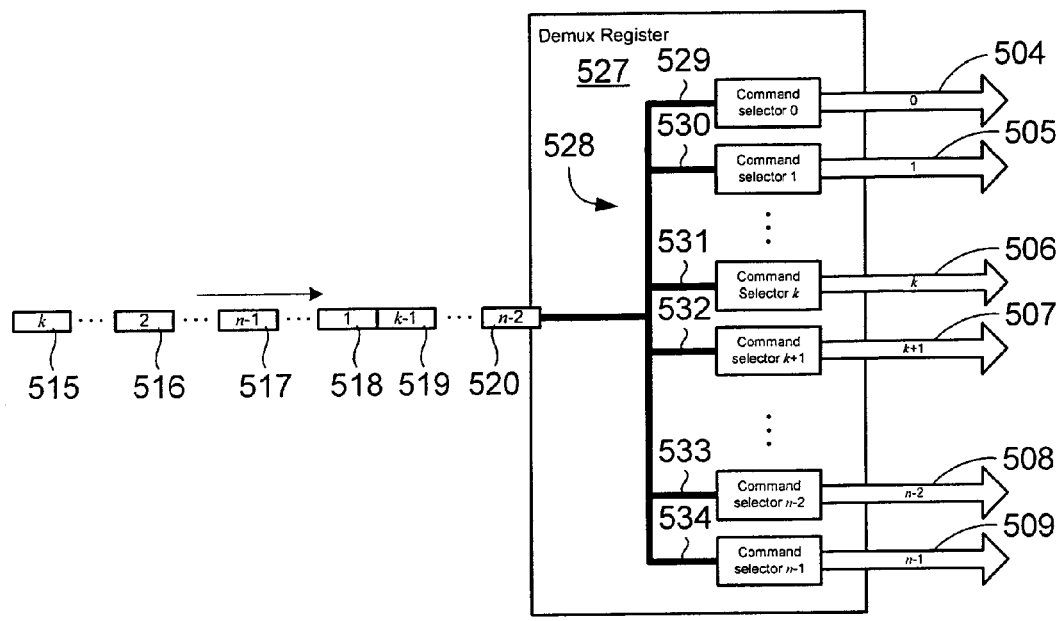
FIGS. 5C-D show a schematic representation of a second demultiplexer register configured in accordance with other embodiments of the present invention.

FIG. 5C shows a schematic representation of a second demux register 527 configured in accordance with embodiments of the present invention. The demux register 527 comprises n command selectors denoted 0 through n−1, one command selector for each of the n VMDs shown in FIG. 5A, and a broadcast bus 528. The memory controller sends time-division multiplexed commands 515-520 on the command path 510 to the demux register 527 as described above with reference to FIG. 5B. The command selectors are electronically connected to a broadcast bus 528 via branches 529-534, and each command selector is connected to one of the VMDs via a set of signal lines of the command bus. In FIG. 5C, six of the n sets of signal lines of the command bus are represented by directional arrows 504-509 corresponding to the sets of signal lines 504-509 and are labeled with the index of the associated VMD shown in FIG. 5A. As shown in FIG. 5C, each command is broadcast to all of the n command selectors. Each command selector is configured to extract the VMD address embedded in the command to determine whether the command is to be forwarded on to the corresponding VMD or whether the command is addressed to a different VMD, in which case the command is discarded. Thus, for each command that is broadcast to all n command selectors, the command is only sent by one of the command selectors to a corresponding VMD. For example, the demux register 527 receives and broadcast the command n−2 520 to all n of the command selectors 0 through n−1. However, because the command n−2 520 includes the address of the $VMD_{n-2}$, the command selector n−2 sends the command n−2 520 to the $VMD_{n-2}$ over the set of signal lines 508 and the other command selectors discard the command n−2 520. Note that each command is processed separately by the demux register 527 within a particular time interval before a subsequent command is processed.

Figure 5D:
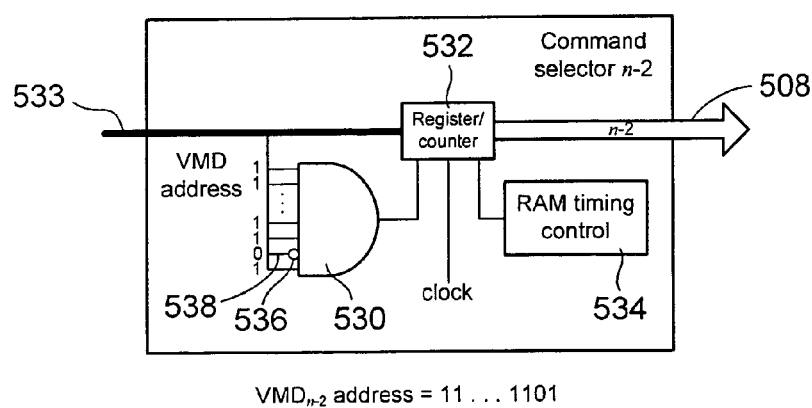

FIG. 5D shows a schematic representation of an exemplary command selector n−2 configured in accordance with embodiments of the present invention. The other n−1 command selectors are analogously configured. The command selector n−2 comprises an AND gate 530, a register/counter 532, and a random access memory ("RAM") timing control 534. Commands are input to the command selector n−1 on the branch 533. The AND gate 530 extracts the VMD address embedded in each command and receives the system clock signal. The AND gate 530 is configured to send a select signal to the register/counter 532 when the extracted VMD address matches the address of corresponding $VMD_{n-2}$. The register/counter receives the clock signal to determine when the register/counter latches the command, and can be configured to act on the select signal on every rising and/or falling clock edge. The register/counter 532 is a buffer that temporarily stores the command and sends the command to the corresponding $VMD_{n-2}$ when the select signal is received from the AND gate 530. The register/counter 532 also includes a counter that performs cache line and command partitioning as described above with reference to FIG. 5B. The RAM timing control 534 controls the counter portion of the register/counter 532.

In general, an AND gate outputs a signal corresponding to the bit "1" when all of the input signals correspond to the bit "1" and outputs a signal corresponding to the bit "0," when at least one of the input signals corresponds to the bit "0," where bits "1" and "0" can represent high and low voltages of a signal, respectively. The AND gates of the command selectors 0 through n−1 may include inverters on certain input signal lines. An inverter converts a signal associated with the bit "0" into a signal associated with the bit "1" and vice-versa. The AND gates include inverters on certain input signal lines in order to convert the VMD address representing the corresponding VMD into a bit stream comprising all "1" bits. The AND gate then outputs a select signal corresponding to the bit "1" to the register/counter 532. For example, assume the VMD address of the $VMD_{n-2}$ comprises a bit stream 11 . . . 1101. The AND gate 530 includes an inverter 536 that inverts the voltage of the signal entering the AND gate 530 on line 538. Thus, as shown in FIG. 5D, when the VMD address embedded in a command matches the address 11 . . . 1101, the address is converted to 11 . . . 1111, and the AND gate 530 outputs the select signal representing the bit "1" to the register/counter 532, which latches the command onto the set of signal lines 508 when indicated by the clock. For other addresses, the bit stream entering the AND gate 530 includes at least one "0" bit and AND gate 530 outputs no signal or a low signal corresponding to the bit "0." Thus, the register/counter 532 does not latch the command onto the set of signal lines 508.

A number of different MCDIMM embodiments are described below with reference to FIGS. 6-8. Each embodiment represents a different demux register and command bus configuration and are in no way intended to be exhaustive of the number of different demux registers and command buses that can be configured in accordance with embodiments of the present invention.

Figure 6A:
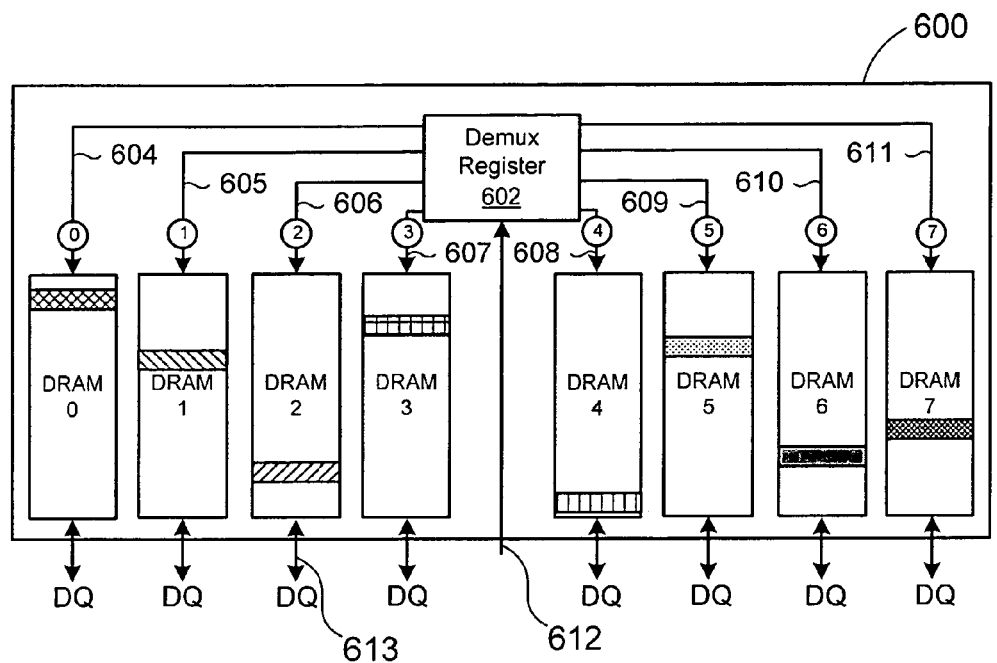
FIGS. 6A-6D show schematic representations of a first example of a multi-core, dual in-line memory module and two associated demultiplexer registers configured in accordance with embodiments of the present invention.
Figure 6B:
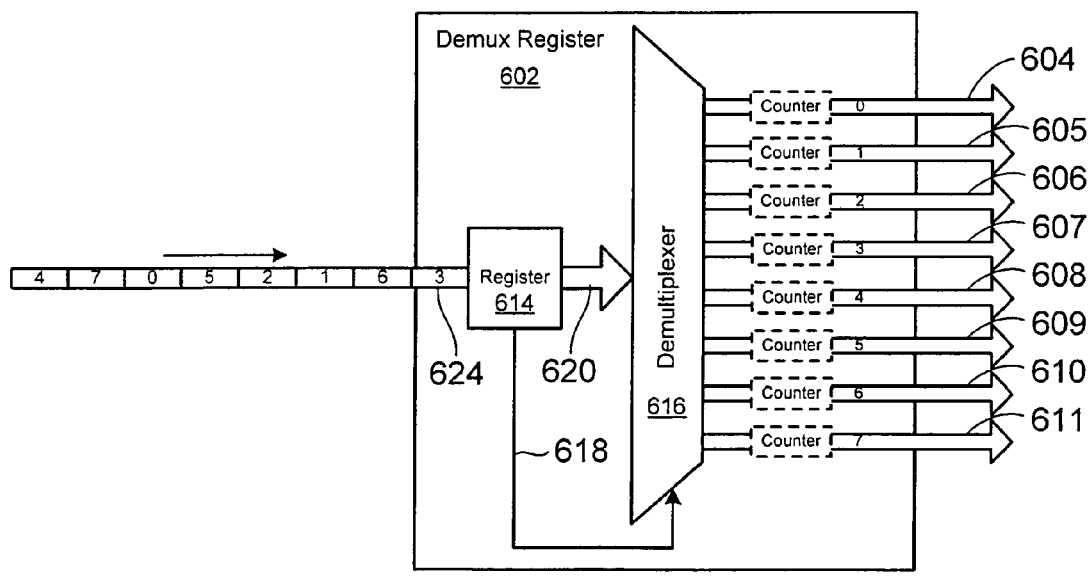

FIGS. 6A-6B show schematic representations of a MCDIMM 600 and associated demux register 602, respectively, configured in accordance with embodiments of the present invention. As shown in FIG. 6A, the MCDIMM 600 includes 8 VMDs, each of which comprises a single DRAM chip labeled 1-8. The command bus is composed of eight sets of signal lines 604-611 that connect each of the DRAMs 1-8 with the demux register 602. Commands are sent to the demux register 602 from a memory controller (not shown) on the command path 612. According to $\log_2 n$, where n is equal to 8, each of the DRAMs 1-8 can be assigned one of the three bit VMD addresses 000, 001, 010, 011, 100, 101, 110, and 111, which are included in the commands sent from the memory controller to the demux register 602. Each of the DRAM chips 1-8 receives different commands through the command bus and transfers data, independent of other DRAM chips, via its own data bus, represented by double headed arrows, such as double headed arrow 613.

In certain embodiments, the demux register 602 of FIG. 6B comprises a register 614 and a demultiplexer 616. The memory controller prepares each command with the VMD address corresponding to the DRAM chip that is to receive the command. As shown in the example of FIG. 6B, each of the commands is time-division multiplexed and represented by a rectangle labeled with an integer associated with one of the DRAM chips 1-8. The register 614 receives each of the commands in series, reads the VMD address, and sends the VMD address and the command to separate inputs of the demultiplexer 616, as represented by directional arrows 618 and 620, respectively. The demultiplexer 616 uses the VMD address to select the appropriate set of signal lines 604-611 that carries the command to the VMD. The demux register 602 optionally includes counters that may be implemented when the VMD cannot support a long burst cache line.

An example of sending a command to the MCDIMM 600 begins with the memory controller sending a command intended for the DRAM chip 3 along the command path 612 to the demux register 602. As shown in FIG. 6B, the register 614 receives the command 3 624 and transmits the VMD address of the DRAM chip 3 and the command to the demultiplexer 716 along signal lines 618 and 620. Based on the VMD address, the demultiplexer 616 selects the set of signal lines 606 to send the commands to the DRAM chip 3.

Figure 6C:
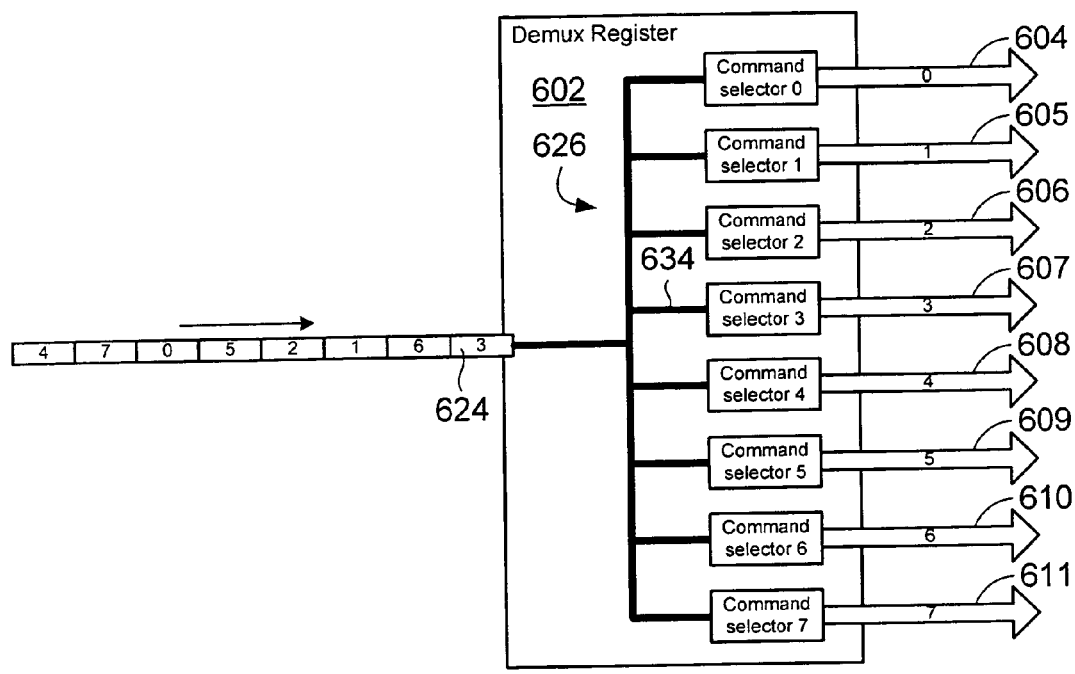

In other embodiments, the demux register 602 of FIG. 6C comprises 8 command selectors denoted 0-7. Each command is broadcast to all 7 command selectors. Each command selector is configured to extract the VMD address embedded in the command to determine whether the command is to be forwarded on to the corresponding VMD or whether the command is addressed to a different VMD and discarded. For example, the demux register 602 of FIG. 6C receives and broadcast the command 3 to all 7 command selectors over broadcast bus 626. However, because the command 3 624 includes the address of $VMD_3$, the command selector 3 sends the command 3 624 to the $VMD_3$ on the set of signal lines 607, and the other command selectors discard the command 3 624.

Figure 6D:
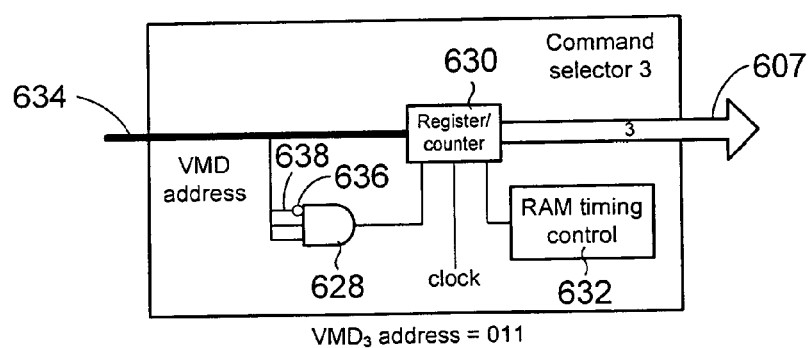

FIG. 6D shows a schematic representation of the command selector 3 configured in accordance with embodiments of the present invention. The command selector 3 comprises an AND gate 628, a register/counter 630, and a RAM timing control 632. The other command selectors are analogously configured. Commands are input to the command selector 3 on branch 634. The AND gate 628 extracts the VMD address portion of each command and to determine when the register/counter 630 is selected. When a VMD address is input to the AND gate 628 an inverter 636 inverts the bit value entering the AND gate 628 on line 638. Thus, when the VMD address embedded in a command matches the three bit address 011 of the $VMD_2$, this address is converted into 111, and the AND gate 628 outputs the select signal corresponding to the bit "1," otherwise no select signal is sent to the register/counter 630. The clock signal is also input to the register/counter 630 so that the register/counter 630 latches the command on the rising and/or falling edges of the clock signal.

In the example MCDIMM 600 of FIGS. 6A-6B, only one DRAM chip is involved per memory access request. Shaded regions of the DRAM chips represent different independent memory requests associated with different commands. Each DRAM chip receives a command through the command bus and independently transfers data using its own data bus. Thus fewer bits are activated, saving energy for activation and precharging. However, more time may be needed to deliver the data than a conventional DIMM since the data bus sizes are smatter than the data bus sizes in convention DIMMs. In order to transfer the data, the data may be partitioned into smaller data portions that are serialized, where each portion is sent separately from a VMD to the memory controller. However, serializing the data extends the amount of time needed to send the data as compared to sending the data from a conventional DIMM to a memory controller. This additional serialization latency problem may have a negative impact on system performance. The serialization latency problem can be mitigated by configuring the MCDIMM with VMDs comprising two or more DRAM chips.

Figure 7A:
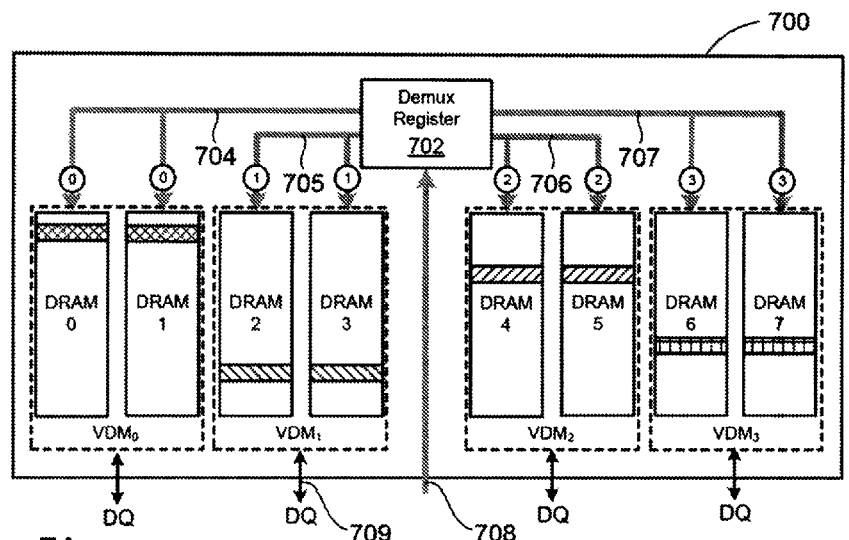
FIGS. 7A-7D show schematic representations of a second example of a multi-core, dual in-line memory module and two associated demultiplexer registers configured in accordance with embodiments of the present invention.
Figure 7B:
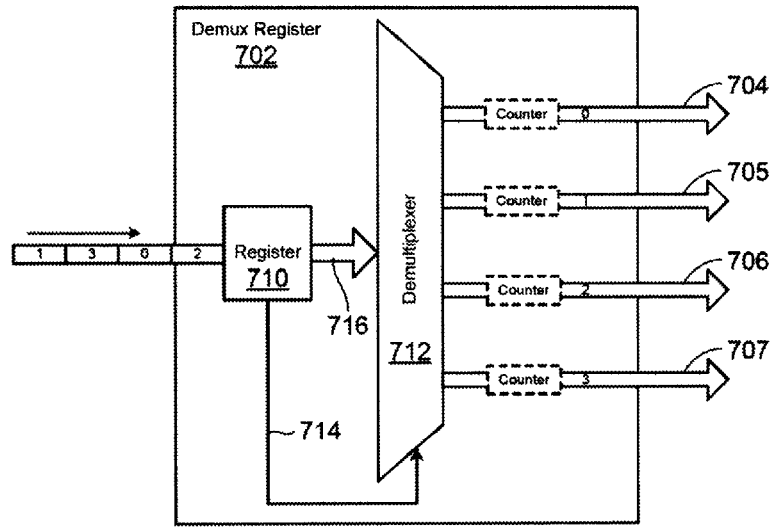
Figure 8:
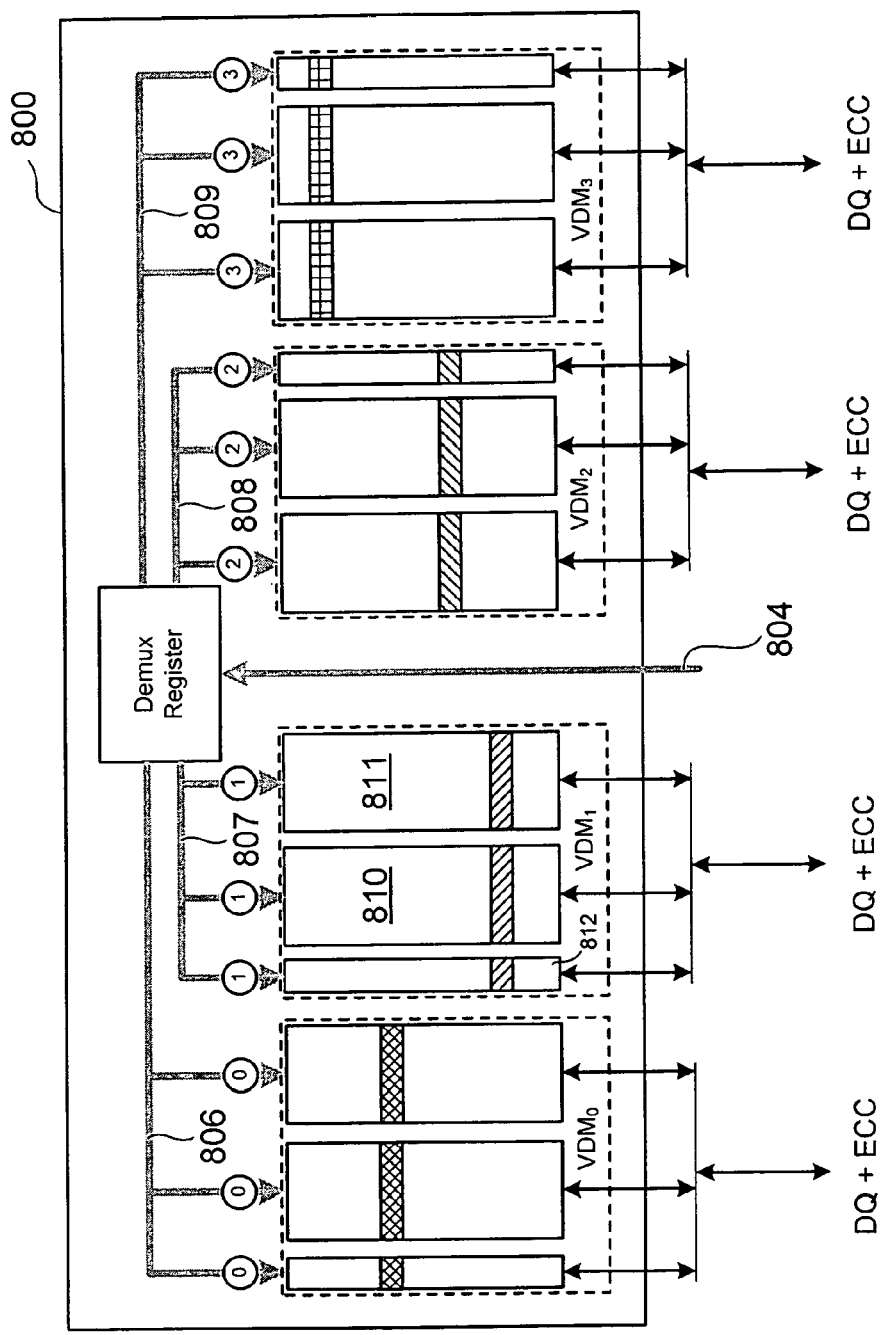
FIG. 8 shows a schematic representation of a multi-core, dual in-line memory module configured to support error correcting codes in accordance with embodiments of the present invention.

FIGS. 7A-7B show schematic representations of a MCDIMM 700 and associated demux register 702 configured in accordance with embodiments of the present invention. As shown in FIG. 7A, the MCDIMM 700 includes 4 VMDs identified by $VMD_k$, where k is an integer ranging from 1 to 4. Each of the VMD's comprises two DRAM chips. The command bus is composed of four sets of signal lines 704-707 connecting each of the VMDs to the demux register 702. Commands are sent to the demux register 702 from a memory controller (not shown) along a command path 708. According to $\log_2 n$, where n is equal to 4, each of the VMDs can be assigned one of the two bit VMD addresses 00, 01, 10, and 11 which are included in the command to identify the VMDs intended to receive the command. Each of the VMDs receives different commands through the command bus and transfers data independent of other VMDs via its own data bus, represented by double headed arrows, such as double headed arrow 709.

In FIG. 7B, the demux register 702 comprises a register 710 and a demultiplexer 712. Each of the commands is time-division multiplexed and represented by a rectangle labeled with an integer identifying one of the VMDs of the MCDIMM 700. The register 701 receives each of the commands in series, reads the DRAM address, and sends the DRAM address and the command to the demultiplexer 712 along signal lines 714 and 716, respectively. The demultiplexer 712 uses the VMD address to send the command to the VMD on the appropriate set of the sets of signal lines 704-707.

Figure 7C:
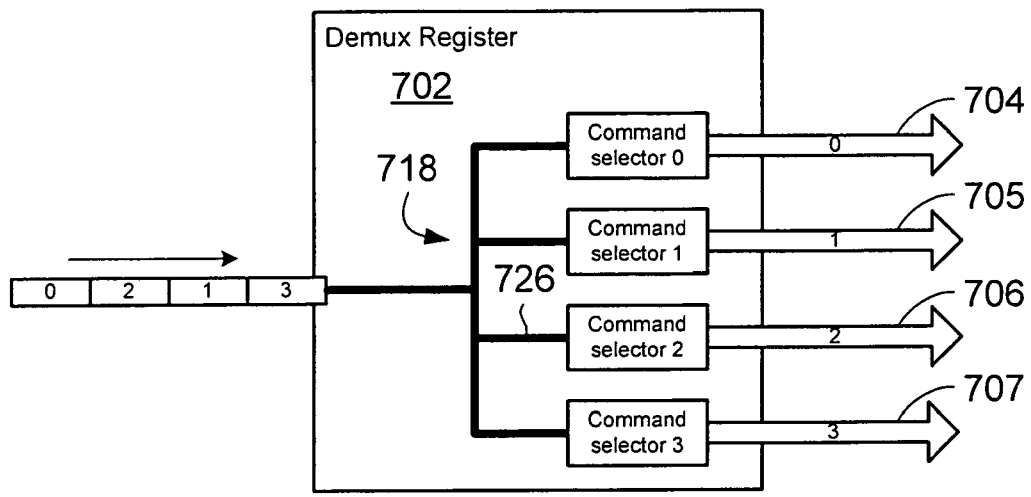

In FIG. 7C, the demux register 702 comprises four command selectors denoted 0-3. Each command is broadcast over a broadcast bus 718 to all four command selectors that extract the VMD address embedded in the command to determine whether the command is to be forwarded on to the corresponding VMD or whether the command is to be discarded.

Figure 7D:
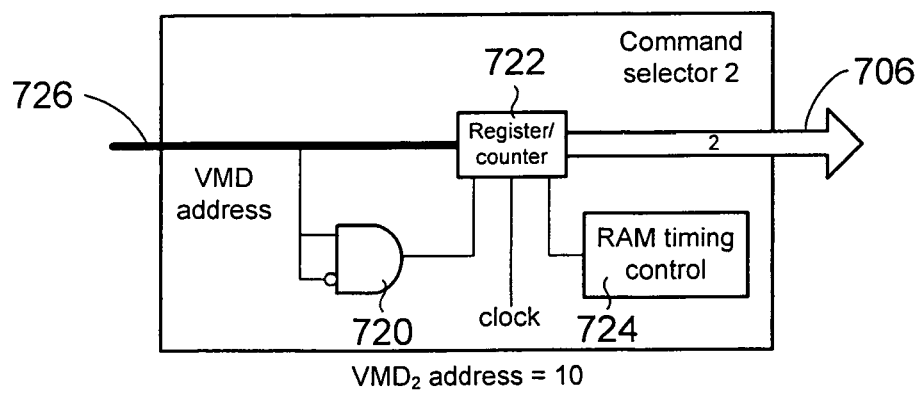

FIG. 7D shows a schematic representation of the command selector 2 configured in accordance with embodiments of the present invention. The command selector 2 comprises an AND gate 720, a register/counter 722, and a RAM timing control 724. Commands are input to the command selector 2 on branch 726. The AND gate 720 extracts the VMD address portion of each command to determine when the register/counter 722 is selected. When the VMD address matches the two bit VMD address 10, this address is converted into 11, and the AND gate 720 outputs the select signal corresponding to the bit "1" to the register/counter 722, otherwise no select signal is sent to the register/counter 722 and the command is discarded. The clock signal input to the register/counter 722 latches the command on the rising and/or falling edges of the clock signal.

In the example MCDIMM 700 of FIGS. 7A-7B, two DRAM chips are involved per memory access request that are represented by identically shaded regions of the DRAM chips. The DRAM chips of each VMD receive the command through the command bus and independently transfer data using an associated data bus. Thus fewer bits are activated than a conventional DIMM, but like the MCDIMM 600, the serialization problem may still occur and more time may be needed to transfer that same amount of data than conventional DIMMs. Note that the demux register 702 also optionally includes counters when multiple burst are needed to write a cache line.

DRAM chips can also be grouped together to support an error correction code ("ECC") in order to provide protection of data and data transfers from soft errors, which are often disruptions of individual memory cells. ECC can typically be implemented by adding an ECC bit for every 8 bits of data, usually by accessing a multiple 9 DRAM chips in parallel instead of a multiple of 8 DRAM chips. Thus, in certain embodiments, individual DRAM chips can be configured with additional data cells and bus bits that are output over 9 bit data paths instead of 8 bit data paths.

In other embodiments, a portion of the chip address range can be dedicated to ECC bits and the same command translation feature of the demux register can be used to transfer data and ECC bits in a group.

In still other embodiments, a separate lower storage capacity DRAM chip can be paired with multiple DRAM chips per VMD. FIG. 8 shows a schematic representation of a MCDIMM 800 configured to support ECC in accordance with embodiments of the present invention. As shown in the example of FIG. 8, the MCDIMM 800 includes demux register 802 that receives commands from a memory controller (not shown) over command path 804 and includes a command bus comprising four set of signal lines 806-809. Each set of signal lines carriers commands to each of the VMDs. The MCDIMM 800 is nearly identical to the MCDIMM 700, except each VMD includes an additional small capacity DRAM chip. For example, $VMD_2$ includes two regular DRAM chips 810 and 811 that are used to store data and an additional relatively smaller storage capacity DRAM chip 812 for storing ECC bits. The data and ECC bits of each VMD can be read out separately on the data bus.

Figure 9:
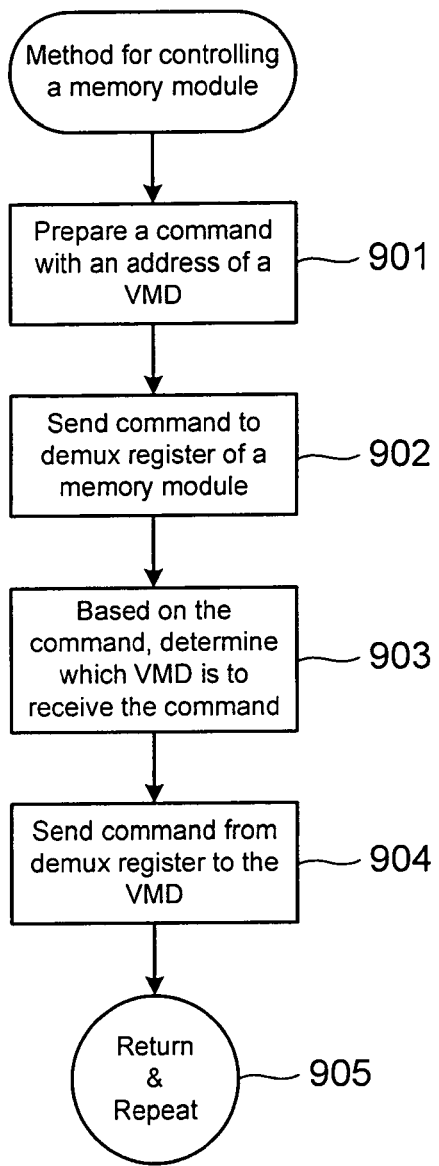
FIG. 9 shows a control-flow diagram of a method for controlling a memory module comprising at least one virtual memory device in accordance with embodiments of the present invention.

FIG. 9 shows a control-flow diagram of a method for controlling a memory module comprising at least one virtual memory device in accordance with embodiments of the present invention. In step 901, a memory controller prepares a command to be received by one of the VMDs of the memory module by encoding the assigned address of the VMD in the command. In step 902, the memory controller sends the command to the demux register of the memory module. The command is received by the demux register over a command path, as described above with reference to FIG. 5A. In step 903, the demux register includes a register that reads the VMD address of the command and determines which of the VMDs is to receive the command, as described above with reference to FIG. 5B. In step 904, the register sends the command and address to a demultiplexer that, based on the address, selects the appropriate set of signal lines of a command bus on which to place the commands that are sent to the VMD, as described above with reference to FIGS. 5A-5B. In step 905, the method returns and steps 901-904 are repeated for the next memory request.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A memory module comprising:
at least one virtual memory device including at least one memory chip; and
a demultiplexer register electronically connected to the at least one virtual memory device and a memory controller, wherein the demultiplexer register comprises:
a register configured to receive a command identifying one of the at least one virtual memory device from the memory controller and determine a virtual memory device address of the virtual memory device identified in the command;
a demultiplexer configured to receive the command and the address from the register and select a set of signals over which to send the command to the virtual memory device identified in the command; and
a counter that translates a command into multiple commands so that a cache line can be partitioned into cache-line segments by the demultiplexer register, wherein each command is associated with one of the cache-line segments.

2. The memory module of claim 1 wherein the memory chip further comprises a dynamic random access memory chip.

3. The memory module of claim 1 wherein the commands are sent from the memory controller to the demultiplexer register in a time-division multiplexed manner so that each command arrives at the demultiplexer register and is sent to the virtual memory device identified in the command within a fixed duration time interval.

4. The memory module of claim 1 wherein the demultiplexer register further comprises:
at least one command selector, each command selector electronically connected to one of the at least one virtual memory devices; and
a broadcast bus configured to broadcast the command to the at least one command selector, wherein each command selector is configured to extract a virtual memory device address embedded in the command and forward the command to the one of the at least one connected virtual memory devices when the address matches the address of the one of the at least one connected virtual memory devices, otherwise the command selector discards the command.

5. The memory module of claim 4 wherein the command selector further comprises:
an AND gate configured to extract the virtual memory device address from the command and generate a select signal when the address matches the address of the one of the at least one connected virtual memory devices;
a register/counter configured to receive and transmit the command to the connected virtual memory devices when the AND gate provides the select signal, otherwise the register/counter discards the command; and
a RAM timing control that controls partitioning of the cache line and the command into smaller cache-line segments.

6. The memory module of claim 1 demultiplexer register electronically connected to the at least one virtual memory device further comprises a command bus disposed between the demultiplexer register and the at least one virtual memory device, wherein the command bus comprises a separate set of signal lines connecting each of the at least one virtual memory devices to the demultiplexer register.

7. The memory module of claim 1 further comprising a command path connecting the memory controller to the demultiplexer register.

8. The memory module of claim 1 wherein the at least one virtual memory device further comprises a memory chip configured to store error correcting code information.

9. A method for controlling a memory module comprising at least one virtual memory device, the method comprising:
preparing a command at a memory controller to include an address corresponding to one of the at least one virtual memory devices;
sending the command from the memory controller to a demultiplexer register of the memory module;
determining which of the at least one virtual memory devices is identified by the address using a register of the demultiplexer register;
translating the command into multiple commands using a counter of the demultiplexer register so that a cache line can be partitioned into cache-line segments by the demultiplexer register, wherein each of the multiple commands is associated with one of the cache-line segments; and sending the multiple commands and associated cache-line segments to the virtual memory device identified by the address using a demultiplexer of the demultiplexer register.

10. The method of claim 9 wherein sending the command from the memory controller to the demultiplexer register further comprises time-division multiplexing the command to arrive at the demultiplexer register and sending the multiple commands and associated cache-line segments to the virtual memory device identified in the command within a fixed duration time interval.

11. The method of claim 9 wherein determining which of the at least one virtual memory devices identified by the address further comprises reading the virtual memory device address embedded in the command.

12. The method of claim 9 wherein the virtual memory device further comprises at least one memory chip.

13. The method of claim 9 wherein the method includes assigning the multiple commands to cache-line segments.

* * * * *